United States Patent [19]

Cay

[11] Patent Number: 4,620,832
[45] Date of Patent: Nov. 4, 1986

[54] FURNACE LOADING SYSTEM

[75] Inventor: Norman S. Cay, Los Gatos, Calif.

[73] Assignee: Motion Manufacturing, Inc., Santa Clara, Calif.

[21] Appl. No.: 587,179

[22] Filed: Mar. 7, 1984

[51] Int. Cl.⁴ .................. H01L 21/324; F27D 3/00
[52] U.S. Cl. ..................................... 414/786; 414/180
[58] Field of Search ............... 414/150, 180, 182, 183, 414/184, 786

[56] References Cited

U.S. PATENT DOCUMENTS

| 3,889,821 | 6/1975 | Bowers et al. | 414/749 |
| 4,008,815 | 2/1977 | Fisk | 414/180 |
| 4,440,538 | 4/1984 | Bowers | 414/183 |
| 4,468,195 | 8/1984 | Sasaki et al. | 414/180 X |

FOREIGN PATENT DOCUMENTS

| 129964 | 11/1978 | Japan | 414/150 |
| 36129 | 4/1981 | Japan . | |

OTHER PUBLICATIONS

GaSonics leaflet entitled "Introducing the Non-Contact Furnace Wafer Loading System that Virtually Eliminates Particulate Generation".
Quartz International Corporation leaflet entitled "Automation Wafer Handling".
Invitation to Showing of Quartz International Corporation Automated Wafer Handling System, held on Nov. 2, 1983.

Primary Examiner—Robert J. Spar
Assistant Examiner—Stuart J. Millman
Attorney, Agent, or Firm—C. Michael Zimmerman

[57] ABSTRACT

A furnace loading system is provided for loading and unloading wafer boats or other receptacles from a furnace tube of the type used in semiconductor processing. The system includes a carrier for supporting the receptacles in a cantilevered manner out of contact with the furnace tube. Actuators are provided for moving the carrier and receptacles into the furnace tube and for depositing the receptacles on the floor of the furnace tube without any contact between the carrier and the furnace tube. The carrier is then withdrawn, completing the loading cycle. Unloading is accomplished by inserting the carrier into the furnace tube while supported in a cantilevered manner. The carrier is then raised to pick up and support the receptacles on the carrier, after which they are withdrawn from the furnace tube. Only the feet of the receptacles contact the furnace tube, reducing particulate matter generation to a minimum. All parts of the apparatus which enter the furnace tube are formed of quartz or another semiconductor grade material. Consequently, the furnace temperature can be maintained at a relatively high level throughout the loading and unloading process without melting or sagging of the loader components. The system leaves less mass in the furnace tube to be heated and cooled, providing for greater uniformity and lower costs in the processing of semiconductors.

1 Claim, 9 Drawing Figures

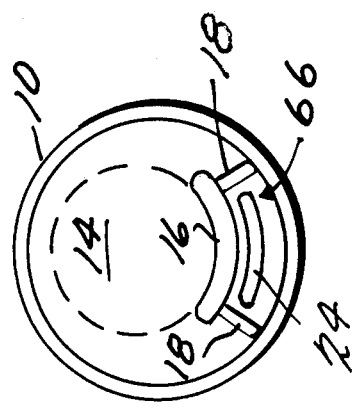
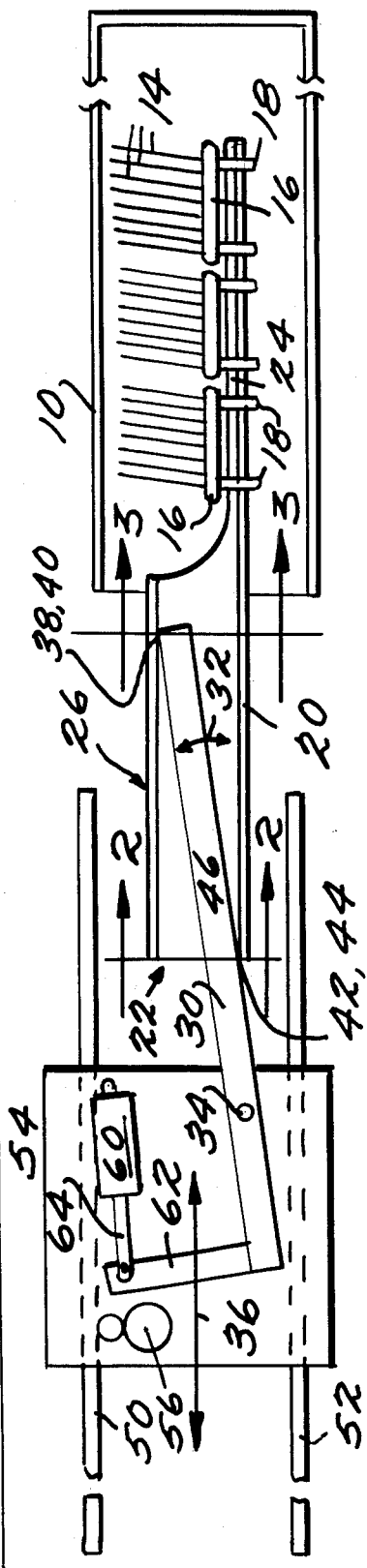
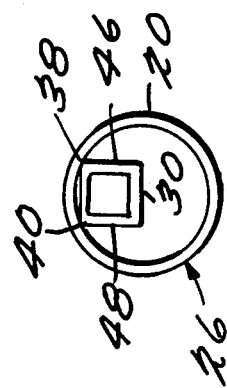
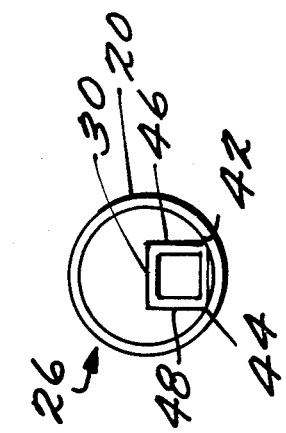

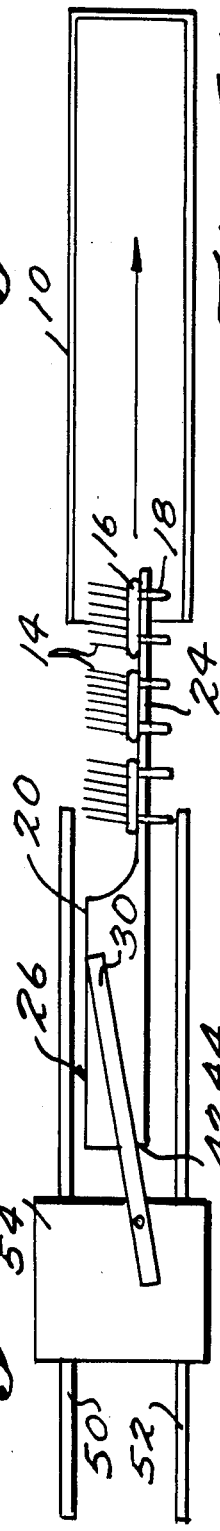
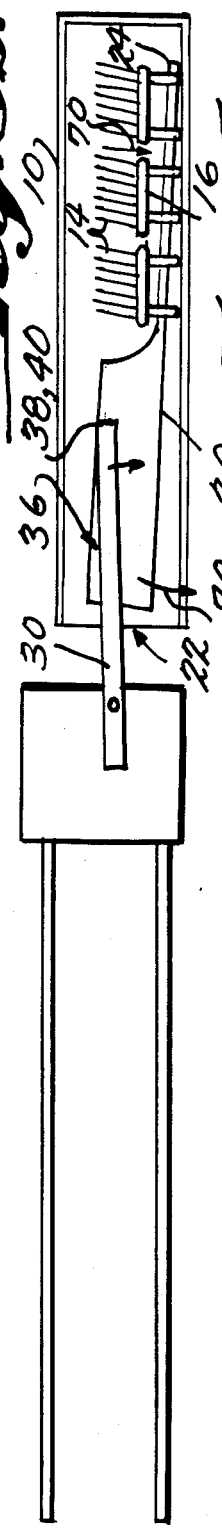
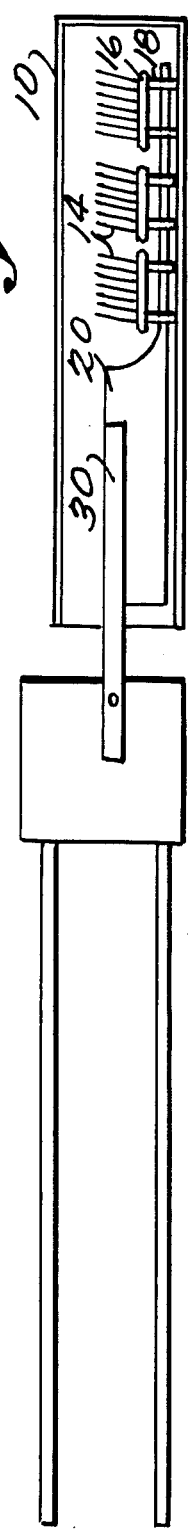
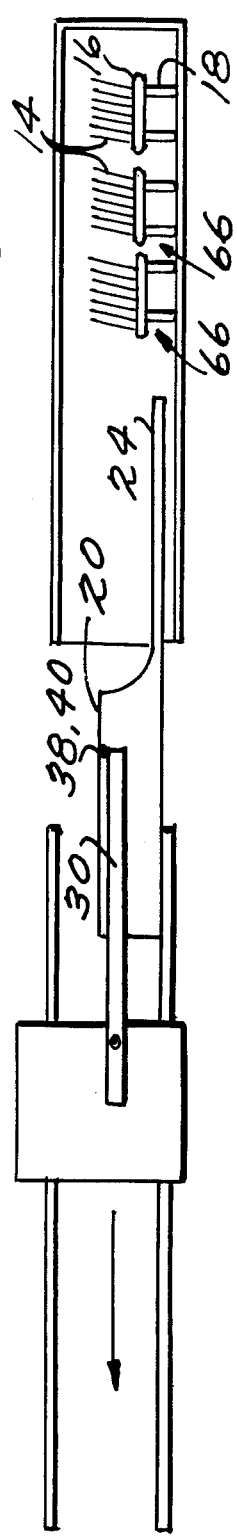

4,620,832

FURNACE LOADING SYSTEM

DISCLOSURE

BACKGROUND OF THE INVENTION

The invention relates generally to systems for handling semiconductor materials such as semiconductor wafers during processing in furnace tubes or the like and more particularly to an improved system for loading and unloading semiconductor materials from a furnace tube used in semiconductor processing.

The processing of silicon and other semiconductor materials to form electronic components involves numerous fabrication steps, some of which require the heating of the semiconductor material to high temperatures. Semiconductor material is generally processed in the form of wafers, which are flat, usually circular discs. Each disc may contain hundreds or thousands of tiny semiconductor components. Cleanliness is of the utmost importance in processing semiconductor wafers because due to the small size of the components, a single speck of dust or even a molecule of contaminant might destroy a component on the wafer. The wafers are therefor processed in ultra clean environments from which potential contaminants are eliminated.

The processing of semiconductor wafers usually includes several heating operations for which the wafers must be loaded into special hightemperature furnaces. The temperatures required, sometimes ranging above 1,000° C., necessitate the use of special materials which neither melt nor release contaminants when heated. One preferred material for use in handling semiconductor wafers is quartz. Those components which must remain in the furnace with the wafers during processing, including the racks or "boats" on which the wafers are retained, are formed of quartz. Other materials suitable for use in semiconductor furnaces include polysilicon and silicon carbide. Together with quartz, these materials, and others possessing similar properties suitable for use in semiconductor processing furnaces, are referred to herein as semiconductor grade materials.

Semiconductor processing furnaces generally consist of one or more elongated cylindrical chambers arranged horizontally with an opening at one end through which loading and unloading of the wafers takes place. The chambers, which are generally formed of quartz, are referred to herein as furnace tubes. Heating elements are positioned exterior of the furnace tubes, and for some processes, gas discharge jets are arranged along the interior of the tubes for the injection of gases. Prior art loading systems for inserting semiconductor wafers into a furnace tube generally consist of wheeled racks made of quartz on which boats and wafers are supported. The racks are rolled into the furnace tube and remain inside during the heating process. Such wheeled racks tend to release particles of quartz into the atmosphere of the furnace tube due to friction. Accordingly, less contaminating techniques have been developed.

One improved technique for loading furnace tubes is to support the wafers in a cantilevered manner within the tube during heating, thus eliminating contact between materials within the tube which could raise contaminating particles. In general this is accomplished by inserting an elongated carrier into the furnace tube carrying the wafers. Because of the high temperature environment which must be maintained for long periods, it has been found that the material from which the carrier is formed will often sag if carrying too great a weight. One way of avoiding this problem is to deposit the carrier on the floor of the furnace tube, where it remains during the heating process. Setting the carrier or another object on to the floor of the furnace tube does pose some risk of raising contaminants into the atmosphere, but the problem is far less than in loading systems which involve friction between parts.

For certain processes, such as those requiring rapid temperature response, the presence of a relatively massive supporting carrier in the furnace tube, either suspended or resting on the floor, presents disadvantages. Other systems for supporting semiconductor wafers in a furnace tube encounter different problems. Systems which support wafers throughout the heating cycle must generally use reinforcing material in the supporting structure, since quartz will sag under heavy loading at high temperatures. Problems associated with the use of different materials in processes involving large temperature gradients must then be dealt with. Foreign materials, even when sealed in quartz, present a potential for contamination due to molecular migration through the quartz. Reinforcing with metals requires special handling of the equipment, since most metals cannot withstand the temperatures in the furnace tube. Loading must therefore be accomplished quickly enough to prevent sag or, alternatively, the furnace must be cooled sufficiently to permit proper loading. Those alternatives present problems for the wafers which include a potential for undesirable thermal shock, increased vibration and increased downtime as the furnace is cooled and reheated.

It would be advantageous to provide a furnace loading system which provides for non-contact loading with improved performance. In particular, it would be advantageous to have a loading system which could withstand high temperatures within the furnace during loading and unloading and which would leave behind less additional mass to be heated by the furnace. Such a system would then require less heating and cooling of the furnace and offer greater control and uniformity in the processing of the semiconductor wafers.

SUMMARY OF THE INVENTION

Accordingly, the invention provides furnace loading means for loading and unloading one or more receptacles for holding semiconductor parts into a furnace tube used in semiconductor processing. The furnace loading means comprises an elongated carrier which includes means for supporting one or more receptacles on the carrier. Carrier support means are provided for supporting the carrier in a cantilevered manner. First actuating means move the carrier support means and a carrier supported thereon between first and second positions in a direction lengthwise to the carrier. The carrier is thereby movable forward from a first to a second position for insertion into a furnace tube and rearward from the second to the first position for withdrawal from a furnace tube. A second actuator is also provided for controlling the elevation of the carrier support means such that a carrier thereon is movable between a raised position for supporting and carrying receptacles and a lowered position for depositing receptacles on an adjacent surface. The first and second actuator means and the carrier support means cooperate to continuously support a carrier thereon in a cantilevered manner out of contact with adjacent surfaces throughout loading and unloading cycles. The loading cycle includes moving a raised carrier forward to the second position, lowering the carrier to deposit receptacles, and moving the lowered carrier rearward to the first position. The unloading cycle includes moving a lowered carrier forward to the second position, raising the carrier to lift receptacles and moving the raised carrier rearward to the first position. In its preferred form, the carrier is supported to rotate slightly as receptacles are deposited and picked up from the floor of the furnace tube to facilitate non-contact loading.

The invention also includes a method of loading and unloading one or more receptacles for holding semiconductor parts into a furnace tube used in semiconductor processing. The method uses an elongated carrier on which one or more receptacles are supported for movement. Steps in the method include supporting the carrier from one end thereof in a cantilevered manner. Simultaneously, means are provided for controlling the elevation of the carrier such that the carrier is movable between a raised position in which the carrier engages and supports receptacles thereon and a lowered position for depositing and disengaging receptacles within a furnace tube. The carrier is made movable into and out of a furnace tube in a direction lengthwise to the carrier. The process further includes continuously supporting the carrier in a cantilevered manner out of contact with adjacent surfaces throughout loading and unloading cycles. The loading cycle includes the steps of moving the carrier while raised from a first position outside the furnace tube forward to a second position within the furnace tube, lowering the carrier to deposit receptacles within the furnace tube, and moving the lowered carrier rearward from the furnace tube to the first position, whereby receptacles are deposited in the furnace tube. The unloading cycle includes the steps of moving the lowered carrier forward from the first to the second positions, raising the carrier to engage and support the receptacles within the furnace tube on the carrier, and moving the carrier rearward from the furnace tube to the first position, whereby the receptacles are removed from the furnace tube.

BRIEF DESCRIPTION OF THE DRAWINGS

FIG. 1 is a plan view in partial cross-section showing a preferred embodiment of a furnace loading means according to the present invention.

FIG. 2 is a cross-sectional view of a portion of the furnace loading means of the present invention taken along line 2—2 of FIG. 1.

FIG. 3 is a cross-sectional view of a portion of the furnace loading means of the present invention taken along line 3—3 of FIG. 1.

FIG. 4 is a cross-sectional view of a portion of the furnace loading means of the present invention taken along line 4—4 of FIG. 1.

FIG. 5 is a sequence of plan views designated FIGS. 5a through 5d, illustrating the loading cycle of the present invention.

DESCRIPTION OF THE PREFERRED EMBODIMENT

Referring to FIG. 1, a loader is shown according to the present invention for loading and unloading semiconductor wafers into a processing furnace tube 10. Furnace tube 10 can either be a single furnace tube or one of several such tubes in a semiconductor processing furnace. Furnace tube 10 is formed of quartz or another semiconductor grade material, is cylindrical in shape and has an opening 12 at one end, through which the loading and unloading of semiconductor wafers 14 takes place. The end of the furnace tube opposite opening 12 may be closed or open, depending on the processes to be performed. For the purposes of the present invention, furnace tube 10 is an elongated cyclindrical chamber with a horizontal axis into which receptacles carrying semiconductor wafers or other similar objects are loaded and unloaded by the furnace loader of the present invention.

The semiconductor wafers 14 which are loaded and unloaded into furnace tube 10 by the present invention are generally in the form of circular discs on which numerous individual semiconductor components are manufactured. The wafers are held in one or more receptacles 16, which serve as racks holding the wafers separate from one another, such receptacles generally being referred to as "boats". The receptacles have legs 18 which rest on the floor of the interior of furnace tube 10 when deposited within the tube by the loader of the present invention.

An elongated carrier 20 supports the receptacles 16 for movement into and out of furnace tube 10. Carrier 20 is formed of any of several semiconductor grade materials, including, for example, quartz, polysilicon or silicon carbide. Carrier 20 has a generally cylindrical shape with an opening 22 at one end and an elongated portion 24 at the other end which serves as a means for supporting receptacles 16 on the carrier. The portion of the carrier adjacent opening 22 is referred to as the support portion 26 and opening 22 is at the support end of carrier 20. Support portion 26 has a circular cross-section and constitutes the majority of the mass of the carrier, for reasons described below. Carrying portion 24 can conveniently be an extension of the cylindrical wall which forms support portion 26. As such, carrying portion 24 is a slightly concave ledge used to support several receptacles 16 and associated wafers 14 thereon in a cantilevered manner for loading into tube 10.

Support for carrier 20 is provided by a lever arm 30, which constitutes a carrier support means. Lever arm 30 is movable up and down in the directions of arrows 32 around a pivot point 34. The lever arm is also movable in a direction parallel to the axis of furnace tube 10, indicated by arrows 36. As such, lever arm 30 provides all the necessary movements to accomplish loading and unloading of the furnace tube. Lever arm 30 extends into and engages support portion 26 of carrier 20 to support the carrier in a cantilevered manner. The lever arm has a generally rectangular cross-section, as can be seen in FIGS. 2 and 3. Since the lever arm is rectangular and the opening and body of carrier 20 are cylindrical, several points of contact exist when the lever arm is inserted into and supports carrier 20. In the relative positions shown in FIG. 1, with the carrier supported on the lever arm in a cantilevered manner, the rectangular lever arm contacts the topside of carrier 20 at points 38 and 40 (FIG. 3) and the bottom of the carrier within opening 22 at points 42 and 44 (FIG. 2). The upwardly facing or top surface and downwardly facing or bottom surface of lever arm 30 faces, respectively, the downwardly facing surface and upwardly facing surface of the cavity inside support portion 26. These facing surfaces are also referred to herein as support surfaces since they are the surfaces contacted during support of the carrier by the lever arm. Because there are four spaced apart contact points at 38, 40, 42 and 44 between carrier 20 and lever arm 30, the carrier is highly stable and not subject to sideways movement. Furthermore, the rectangular lever arm carries the weight of carrier 20 through the parallel sides 46 and 48 of the lever arm along lines of compression in which extend between points 38 and 42 along side 46 and between points 40 and 44 along side 48. As such, lever arm 30 can carry a relatively large mass. Lever arm 30 can be formed entirely of quartz or another semiconductor grade material because such material has adequate strength in compression to sustain the weight of a fully loaded carrier. Lever arm 30 therefore includes no metal or other reinforcing of any kind and is formed entirely of semiconductor grade material.

Means are provided for moving a carrier on lever arm 30 between a first position outside the furnace tube and a second position within the furnace tube in the direction of arrows 36. A pair of guide tracks 50 and 52 are provided which extend lengthwise in a direction parallel to carrier 20. The loader drive mechanism is supported on guide tracks 50 and 52, which can be conveniently mounted on a processing furnace cabinet, for example. The loader drive mechanism is located within a housing 54 from which lever arm 30 extends. A first actuator in the form of a transport motor 56 drives the entire loader mechanism along guide tracks 50 and 52. Any conventional drive train, such as a gear or frictional roller can be used as a motive linkage between motor 56 and one or the other of the guide tracks.

A second actuator in the form of a pneumatic cylinder 60 controls the elevation of the carrier 20 by rotating lever arm 30 about its supporting pivot 34. Cylinder 60 can conveniently be a pneumatic actuator linked to a bellcrank 62 which connects to the end of lever arm 30. In such a configuration, when the cylinder is extended an actuating member 64 pushes against bellcrank 62, causing lever arm 30 to pivot around point 34, raising carrier 20. When the pneumatic cylinder is retracted, carrier 20 is similarly lowered. As such, the second actuator controls the elevation of the lever arm and a carrier supported thereon. Compressed nitrogen gas or another fluid can be used to operate pneumatic cylinder 60, if conveniently available. It has been found that the use of a pneumatic actuator provides for smooth movements when the carrier is raised and lowered, although other types of actuators could be used.

FIG. 4 shows a cross-sectional view of the furnace tube 10 with a receptacle 16 deposited on the floor of the furnace tube. In such a position, the receptacles rest on the bottom of the furnace tube on legs 18. The carrying end 24 of carrier 20 extends beneath the receptacles 16 in a channel 66 formed between legs 18. The channel 66 extends beneath each receptacle 16, and sufficient clearance should be provided to permit the carrying portion 24 of carrier 20 to enter and be withdrawn from the channel without having frictional contact with the receptacles or the furnace tube.

FIG. 5 illustrates the steps in the process of loading and unloading semiconductor wafers from a furnace tube in accordance with the present invention. Throughout the process, the transport actuator and elevation actuator cooperate to move lever arm 30 forward into the furnace tube and rearward out of the furnace tube and also act to raise and lower carrier 20. The movement of the actuators produces loading and unloading cycles during which carrier 20 is continuously supported in a cantilevered manner out of contact with furnace tube 10.

FIG. 5a shows the loader in a first position withdrawn from the furnace tube with three receptacles supported on carrying portion 24 of carrier 20. The receptacles each contain a number of semiconductor wafers 14. The carrier, receptacles and semiconductor wafers are all supported in a cantilevered manner by lever arm 30. The loading cycle of the present invention begins with the raised carrier being moved forward toward a second positon within furnace tube 10. When the loader mechanism reaches its second position, the carrier and the forward portions of lever arm 30 are within furnace tube 10 as shown in FIG. 5b. Once the carrier has been moved laterally to its second position, pneumatic actuator 60 is used to lower the carrier to deposit the receptacles on the floor of the furnace tube.

FIG. 5b shows the next step in the loading cycle, depositing the receptacles within tube 10. A particular feature of the construction of carrier 20 is its weight distribution, which is employed in the loading and unloading cycles to maintain the carrier out of contact with the furnace tube. With lever arm 30 within support portion 26 of carrier 20, the lever arm contacts and supports the carrier primarily at points 38, 40 (see FIG. 3). Those points are at the outer end of lever arm 30 and together constitute a support point for the carrier. The mass distribution of the carrier around support point 38, 40 provides greater weight on the support end side of the carrier—to the left of the support point in FIG. 5b—than on the carrying end side. As such, the carrier will tend to pivot in the direction of arrows 70 when weight is removed from carrying portion 24. Conversely, when weight is added to carrying portion 24, the carrier will pivot around the support point in the opposite direction from arrows 70. The limits of such rotation are determinded by the size of lever arm 30 with respect to opening 22 in the carrier. The size of the opening, and the various dimensions of carrier 20 are selected so that as lever arm 30 decends in the direction of arrow 72, the carrier will remain out of contact with the furnace tube. As shown in FIG. 5b, as lever arm 30 lowers carrier 20, receptacles 16 are deposited on the floor of furnace tube 10 sequentially, beginning with the outermost receptacle. As each receptacle is deposited on the floor of the furnace tube, its weight is removed from the carrying end of carrier 20. Because of the mass distribution of the carrier, the loss of weight at the carrying end causes simultaneous rotation of the carrier in the direction of arrows 70. During this process, lever arm 30 continues to descend in the direction of arrow 72. When all the carriers are deposited on the floor of the furnace tube, the lever arm and carrier become substantially horizontal, as shown in FIG. 5c.

The final step in the loading cycle is the movement of lever arm 30 and the carrier 20 rearward from the first to the second position, which withdraws the carrier completely from the furnace tube. FIG. 5d illustrates such withdrawal, which leaves the receptacles and the wafers thereon within furnace tube 10. During the entire loading process, the carrier is maintained out of contact with the furnace tube. After the receptacles have been deposited in the furnace tube, the carrier is also out of contact with all receptacles. Only the locations where the legs of receptacles 16 touch furnace tube 10 is there any contact between parts.

After the semiconductor wafers have been heated or otherwise processed in the furnace tube, the unloading cycle is performed to remove the receptacles from the furnace tube. The unloading cycle is a reversal of the loading cycle. A lowered carrier is first moved forward from the first to the second position within furnace tube 10. The elongated ledge forming the carrying portion 24 of carrier 20 will pass into the respective channels 66 of each receptacle, touching neither the receptacles nor the furnace tube. Since no weight is on the carrying portion of the carrier, the heavier weight of supporting portion 26 will keep the carrier horizontal, as shown in FIGS. 5c and 5d. Lever arm 30 is then raised, which causes the carrier to contact and support the receptacles. As the weight of the receptacles bears down on the carrying end 24 of the carrier, the carrier will begin to pivot around support point 38, 40 until the lower lever arm contact points 42 and 44 contact the carrier opening 22. Further raising of the lever arm will cause the carrier to lift the receptacles from the floor of furnace tube 10, where they will be supported in a cantilevered manner. Finally, the raised carrier is moved rearward from the second position to the first position, withdrawing the receptacles from the furnace tube.

The loading and unloading cycles of the present invention eliminate all frictional contact between objects within the furnace tube. Only the points at the base of legs 18 on each of the receptacles have any contact with the furnace tube. As such, the generation of contaminating particulate matter within the furnace tube is reduced to an absolute minimum. Furthermore, only the relatively low-mass receptacles remain in the furnace tube during the heating or other processes which are performed. This is advantageous over systems in which the entire carrier structure is deposited within the furnace tube and must be heated and cooled with the semiconductor wafers. The present invention allows for greater temperature control and can perform processes which employ a relatively rapid temperature response, for example. By depositing only the receptacles, less mass is heated and cooled by the furnace, lowering energy costs. If gas discharge jets are located along the floor of the furnace tube, a carrier deposited in the tube will tend to interfere with the operation of such jets. By depositing only wafer handling boats or other receptacles in the furnace tube, greater uniformity is achieved in the heating of the wafers as well as in other processes being performed. The use of receptacles also reduces the points of contact between objects in the furnace tube to a minimum.

Because the carrier and lever arm are formed entirely of quartz or another semiconductor grade material, the problems associated with the use of different reinforcing materials is eliminated. This simplifies the wafer handling process. When holders or supports are made of metal or contain metal reinforcing, the furnace must be cooled to at least below the melting point of the metal to prevent destruction of the loader. Alternatively, if the furnace remains heated above the melting point of key loader parts, the loading and unloading process must be done quickly enough to avoid damage to the loader mechanism. Both alternatives have disadvantages. Cooling down a furnace to the melting point of most metals conventionally used in furnace loaders, which is several hundred degrees lower than the equivalent melting point of quartz, and then reheating it takes time and requires a considerable expenditure of energy. Rapid loading and unloading presents the problems of vibration and an increased risk of particulate contamination. In the apparatus of the present invention, only quartz or another semiconductor grade material enters the furnace tube. The entire carrier and at least the forward portions of the lever arm which extend into the furnace tube are fabricated entirely of semiconductor grade material. For this reason, furnace temperatures can be maintained at a higher lever during loading and unloading. The loading and unloading cycles can also operate at very low speeds, reducing vibration and decreasing the likelihood of contaminants entering the furnace tube.

Alternative embodiments are possible within the scope of the present invention. For example, the receptacles which are shown and described are illustrative only, and other shapes, sizes and configurations of semiconductor handling boats could be used as receptacles with the apparatus of the present invention. In particular, it would be possible to employ alternative types of receptacles which hold semiconductor wafers in various orientations or perform different processes from the one described herein. The exact configuration of the furnace tube could also vary from that shown and described above. A furnace tube which can be sealed during processing could readily be loaded and unloaded by the present invention. In such a sealable furnace tube, the ends of the tube can be sealed once the carrier is withdrawn, for example. Alternative systems for effecting the pivoting of the carrier around its support point could also be used. Instead of providing a mass distribution which produces the appropriate motion, various tensioning or spring loading systems could be used to maintain the carrier generally horizontal as it is raised and lowered.

The present invention provides improved performance over prior art non-contact furnace loading systems. The apparatus and method described provides a loading system which deposits less mass in the furnace tube to be heated by the furnace. It also affords greater control and uniformity in the processing of semiconductor wafers.

What is claimed is:

1. A method of loading and unloading one or more receptacles for loading semiconductor parts into a furnace tube used in semiconductor processing using an elongated carrier having a support end with upwardly and downwardly facing support surfaces and a carrying end with means for supporting such receptacles for movement, the downwardly facing support surface of the carrier support end having a support point and the carrier has a mass distribution around the support point which includes more weight at the support end than at the carrying end when no receptacles are carried thereon and less weight at the support end than at the carrying end when a receptacle is carried thereon, and also using carrier support means having upwardly and downwardly facing support surfaces positioned facing, respectively, the downwardly and upwardly facing support surfaces of the carrier support end, comprising the steps of: supporting the carrier from one end thereof in a cantilevered manner, by contacting the support point of the carrier support end with the upwardly facing surface of the carrier support means providing means for controlling the elevation of the carrier such that the carrier is movable between a raised position in which the carrier engages and supports receptacles thereon and a lowered position for depositing and disengaging receptacles within a furnace tube, moving the carrier into and out of a furnace tube in a direction lengthwise to the carrier, and continuously supporting the carrier in a cantilevered manner out of contact with adjacent surfaces throughout loading and unloading cycles, in which the loading cycle includes the steps of moving the carrier while raised from a first position outside the furnace tube forward to a second position within the furnace tube, with the downwardly facing support surface of the carrier support means contacting the upwardly facing support surface of the carrier support portion, lowering the carrier to deposit receptacles within the furnace tube, by said lowering, removing weight from the carrying end of the carrier and rotating the carrier about the support point in response to the mass distribution until the upwardly facing support surface of the carrier support means contacts the downwardly facing support surface of the carrier support end at least at a point in addition to and longitudinally spaced from the support point, and moving the lowered carrier rearward from said second to said first positions whereby the receptacles are deposited in the furnace tube, and the unloading cycle includes the steps of moving the lowered carrier forward from said first to said second positions with the upwardly facing support surface of carrier support means contacting the downwardly facing support surface of the carrier support end at least at a point in addition to and longitudinally spaced from the support point, raising the carrier to engage and support the receptacles within the furnace tube on the carrier, by said raising, adding weight to the carrying end of the carrier and rotating the carrier about the support point in response to the mass distribution until the downwardly facing support surface of the carrier support means contacts the upwardly facing support surface of the carrier support portion, and moving the carrier rearward from said second to said first positions whereby the receptacles are removed from the furnace tube.

* * * * *